(12) United States Patent
Harker et al.

(10) Patent No.: US 7,108,819 B2
(45) Date of Patent: Sep. 19, 2006

(54) PROCESS FOR FABRICATING HIGH ASPECT RATIO EMBOSSING TOOL AND MICROSTRUCTURES

(75) Inventors: Alan B Harker, Thousand Oaks, CA (US); Jeffrey F DeNatale, Thousand Oaks, CA (US); Dennis R Strauss, Ventura, CA (US)

(73) Assignee: The Boeing Company, Chicago, IL (US)

( * ) Notice: Subject to any disclaimer, the term of this patent is extended or adjusted under 35 U.S.C. 154(b) by 467 days.

(21) Appl. No.: 10/439,503

(22) Filed: May 16, 2003

(65) Prior Publication Data

US 2003/0201249 A1 Oct. 30, 2003

Related U.S. Application Data

(63) Continuation-in-part of application No. 09/939,972, filed on Aug. 27, 2001, now abandoned.

(51) Int. Cl.
*B29C 33/38* (2006.01)
(52) U.S. Cl. .................... 264/219; 205/70; 216/2; 216/11; 216/53; 216/57; 264/293
(58) Field of Classification Search ............. 264/219, 264/293; 216/2, 11, 57, 53; 205/70
See application file for complete search history.

(56) References Cited

U.S. PATENT DOCUMENTS

| | | | |
|---|---|---|---|
| 4,407,695 A * | 10/1983 | Deckman et al. | 216/42 |
| 4,986,496 A | 1/1991 | Marentic et al. | |
| 5,242,711 A | 9/1993 | DeNatale et al. | |
| 5,334,342 A | 8/1994 | Harker et al. | |
| 5,349,154 A | 9/1994 | Harker et al. | |
| 5,384,571 A * | 1/1995 | Myers et al. | 342/4 |
| 5,521,030 A * | 5/1996 | McGrew | 430/1 |
| 5,629,074 A | 5/1997 | Klocek et al. | |
| 5,971,326 A | 10/1999 | Bechert | |

FOREIGN PATENT DOCUMENTS

EP 0 205 289 B1 8/1992

OTHER PUBLICATIONS

DeNatale, et al.; "Fabrication and characterizationof diamond moth eye antireflective surfaces on Ge"; J. Appl. Phys. 71 (3), Feb. 1, 1992; pp. 1388-1393.
Motamedi, et al.; "Antireflection surfaces in silicon using binary optics technology"; Applied Optics, vol. 31, No. 22, Aug. 1, 1992, pp. 4371-4376.

(Continued)

*Primary Examiner*—Allan R. Kuhns
(74) *Attorney, Agent, or Firm*—Harness Dickey & Pierce P.L.C.

(57) ABSTRACT

A tool for embossing high aspect ratio microstructures is provided, wherein the microstructures provide decreased surface reflection and increased transmission through an optical component even at high incident angles. The tool is fabricated by a process that comprises anisotropic etching of columnar pits in a silicon substrate using inductively coupled plasma, followed by isotropic reactive ion etching of the columnar pits to create relatively pointed obelisks. The silicon substrate is then preferably rinsed to remove remaining photoresist prior to vapor depositing a conductive layer thereon. Finally, a metal is electroformed over the conductive layer to form the embossing tool. The embossing tool is then pressed against an optical coating, for example a polymer sheet, to create microstructures having aspect ratios from 1 to 5.

9 Claims, 4 Drawing Sheets

OTHER PUBLICATIONS

Raguin, et al.; "Subwavelength structured surfaces and their applications"; pp. 234-261, undated.

Frank Hartley, Optical surfaces based on arrays of microscopic pillars; NASA's Jet Propulsion Laboratory, pp. 1-2, Jul. 9, 2001.

* cited by examiner

PROCESS FOR FABRICATING HIGH ASPECT RATIO EMBOSSING TOOL AND MICROSTRUCTURES

CROSS-REFERENCE TO RELATED APPLICATIONS

This application is a continuation-in-part of U.S. patent application Ser. No. 09/939,972 filed Aug. 27, 2001 now abandoned.

FIELD OF THE INVENTION

The present invention relates generally to optically active surface textures that are used to control optical performance and more particularly to methods of making embossing tools for fabrication of surface textures as high aspect ratio microstructures in optical coatings.

BACKGROUND OF THE INVENTION

Optically active surface textures are typically employed in applications where surface reflections must be minimized in either the infrared (IR) or visible wavelength regions. The optical coatings with such surface textures generally comprise a dense array of microscopic features, which exhibit little or no diffraction or scattering of the incident light in the designed wavelength region. Generally, the dimensions and spacing of the microscopic features are smaller than the shortest wavelength of incident light in a particular wavelength region. In ideal cases, they should further provide a gradual transition in the effective index of refraction, i.e. a graded index of refraction from the textured surface to the ambient medium. Such microstructures are often referred to as having "moth-eye" surfaces because it has been observed that the eyes of moths reflect almost no light due to the presence of a microscopic texture.

The aspect ratio of the microscopic features is preferably high in order to provide minimal reflection at high incidence angles. In one known microstructure, an aspect ratio of greater than 3 to 1 results in reduced surface reflection and increased transmission through an optical component at incidence angles greater than 75 degrees. Unfortunately, fabrication of such microstructures is relatively complicated, and less complicated fabrication techniques such as standard micro-lithography have been incapable of producing the high aspect ratio microstructures. Additionally, known fabrication methods generally do not provide for a graded index of refraction, which is often required to provide minimal reflection for the incident light.

For example, U.S. Pat. No. 5,334,342 to Harker et al., the contents of which are incorporated herein by reference in their entirety, discloses a method of fabricating a diamond moth-eye surface wherein a polycrystalline diamond thin film is deposited on a substrate using micro-lithographic techniques. Generally, the moth-eye geometry is formed on relatively thick substrate materials rather than on a thin coating, and the geometry is formed on the substrate using a series of micro-lithographic patterning techniques, which may include dry and/or wet etching techniques. The diamond coating is then bonded to a substrate, preferably using a glass layer such as a low-temperature, refractive index-matched Chalcogenide glass.

Further, U.S. Pat. No. 5,629,074 to Klocek et al. discloses a method of embossing a pattern into a sheet of polymeric material, however, the pattern is created using a mold that is formed using a conventional diamond lathe. Unfortunately, the conventional diamond lathe cannot produce relatively high aspect ratio patterns, and as a result, low reflectivity at high incidence angles may not be possible.

Accordingly, there remains a need in the art for a relatively low cost process of forming high aspect ratio moth-eye microstructures using standard etching procedures. The process should further be capable of producing high aspect ratio moth-eye microstructures that provide a graded index of refraction and low reflectivity at high incidence angles in both the visible and infrared wavelength regions.

SUMMARY OF THE INVENTION

In one preferred form, the present invention provides an embossing tool that comprises the negative image of the desired high aspect ratio moth-eye microstructures, hereinafter referred to as etch features. The embossing tool is then used to produce a high aspect ratio microstructure in a material which can be used as an optical coating such as a polymer sheet by pressing the embossing tool against the surface of the optical coating. Accordingly, a high aspect ratio microstructure is created in the coating, which is the desired positive moth-eye texture (the negative image of the etch features in the embossing tool).

Generally, the embossing tool is formed by a process comprising three primary steps. First, an anisotropic etching procedure, such as inductively coupled plasma etching, is used to create columnar etch pits separated by columns in a photoresist-coated substrate, preferably silicon, wherein the columnar etch pits have a suitable aspect ratio. Second, the shape of the columnar etch pits is altered using an isotropic etching procedure such as reactive ion etching to create more pointed obelisk or pyramidal features, thereby forming tapered etch features. Third, the etch features are transferred to a durable embossing tool through an alternative intermediate series of mask transfers. In one embodiment, the silicon substrate is cleaned to remove the residual photoresist after the isotropic etching and a conductive layer is vapor deposited over the etch features to facilitate a subsequent electroforming step that deposits a metal onto the etch features. After electroforming, the silicon substrate may be dissolved in a hot potassium hydroxide solution, leaving an electroformed negative image of the etch features in the metallic tool surface.

The embossing tool is then used to create high aspect ratio microstructures in an optical coating, such as a polymer sheet, by pressing the embossing tool against the optical coating. The optical coating is preferably made of a material that flows sufficiently, when pressed against the tool and optionally heated, to conform its structure to that of the tool. Accordingly, the negative image of the etch features in the embossing tool is created in the optical coating. In a preferred embodiment, the optical coating is made of thermoplastic polymer material. Non-limiting examples of suitable thermoplastic materials include polystyrene, polycarbonate, poly(methyl methacrylate), polychlorotrifluoroethylene, polypropylene, and polyethylene. As a result, a relatively low cost embossing tool for forming high aspect ratio microstructures is provided wherein the microstructures are capable of low reflectivity at high incidence angles in addition to a graded index of refraction in both the infrared and visible wavelength regions.

Further areas of applicability of the present invention will become apparent from the detailed description provided hereinafter. It should be understood that the detailed description and specific examples, while indicating the preferred embodiment of the invention, are intended for purposes of illustration only and are not intended to limit the scope of the invention.

BRIEF DESCRIPTION OF THE DRAWINGS

The present invention will become more fully understood from the detailed description and the accompanying drawings, wherein.

DETAILED DESCRIPTION OF THE PREFERRED EMBODIMENTS

The following description of the preferred embodiments is merely exemplary in nature and is in no way intended to limit the invention, its application, or uses.

Figure 1:
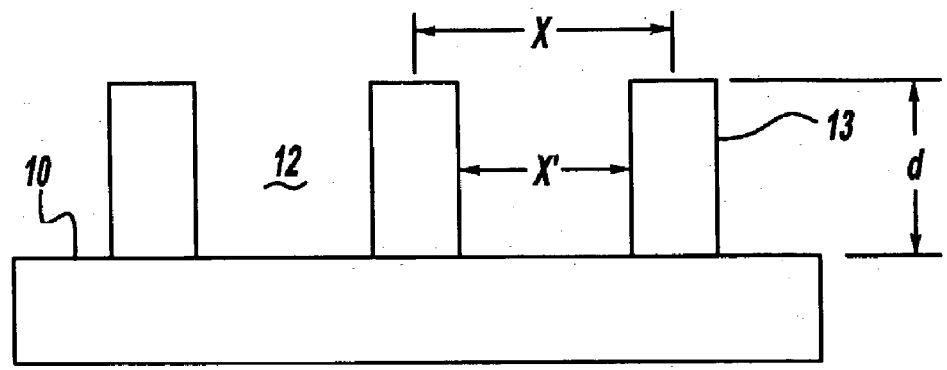
FIG. 1 is a side view of a silicon substrate after an anisotropic etch process step in accordance with the present invention.

Referring to the drawings, a process for forming a high aspect ratio embossing tool and an optically active surface texture in an optical coating is illustrated generally at each process step. Accordingly, FIG. 1 illustrates the first process step, wherein a substrate 10 is etched using an anisotropic reactive ion etching process, preferably inductively coupled plasma, to generate a plurality of high aspect ratio columnar pits 12 between columns 13. The pits are characterized by a depth d as shown. In a preferred embodiment, each pit 12 will have approximately the same depth d.

Preferably, the substrate 10 is silicon, and the sizes of the columnar pits may be varied according to the specific operating requirements of the optical coating. Therefore, the illustration of columnar pits 12 having generally the same size and equal spacing shall not be construed as limiting the scope of the present invention. In a preferred embodiment, a lithographic photomask of fine-scale close-packed features is used on silicon.

Figure 2:
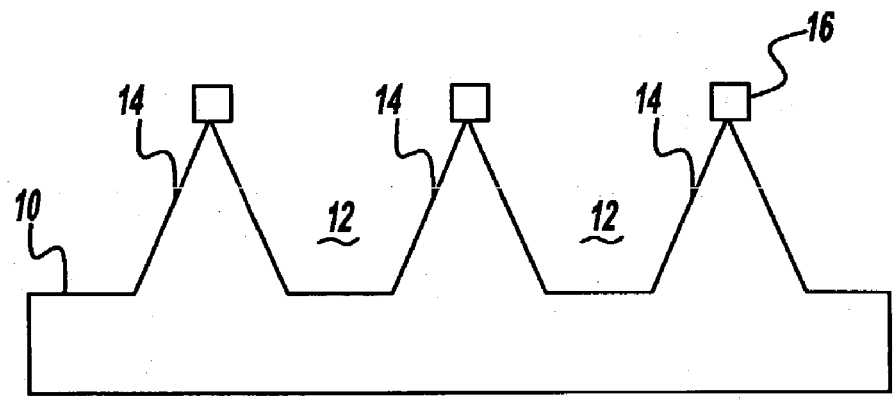
FIG. 2 is a side view of a silicon substrate after an isotropic etch process step in accordance with the present invention.

Referring to FIG. 2, the second process step involves further etching the columns 13 into relatively pointed obelisks, thereby forming tapered etch features 14. The etching for the second process step is preferably an isotropic etch process such as reactive ion etching or liquid etching. As shown, the columns 13 are altered into relatively pointed obelisks by the second etch process to form the etch features 14, in addition to residual tips 16.

Figure 3:
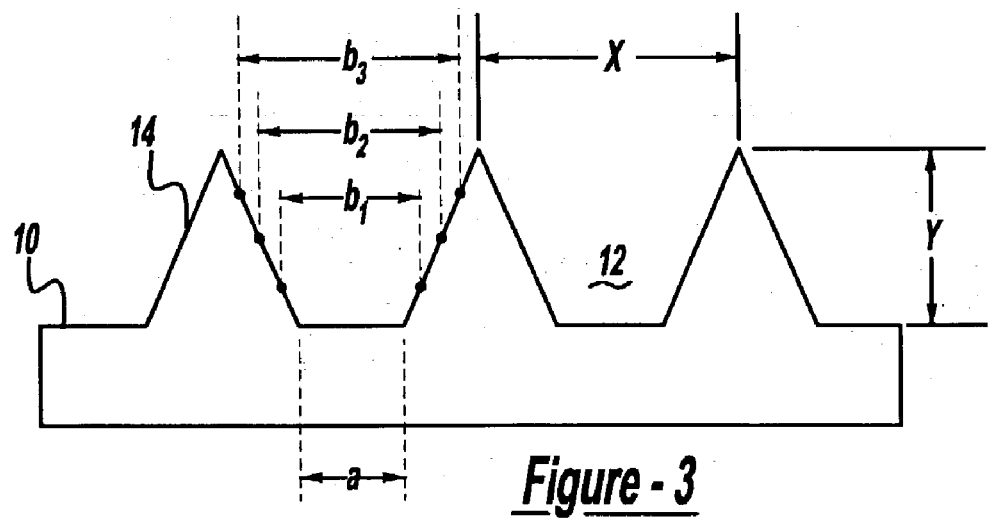
FIG. 3 is a side view of a silicon substrate after a photoresist removal step in accordance with the present invention.

Referring to FIG. 3, in a preferred embodiment the substrate 10 is next subjected to a rinse process, wherein the residual tips of lithographic photoresist 16 are removed from the etch features 14. Further, the substrate 10 is preferably coated with a conductive layer using vapor depositing to facilitate additional process steps as described in greater detail below.

Figure 4:
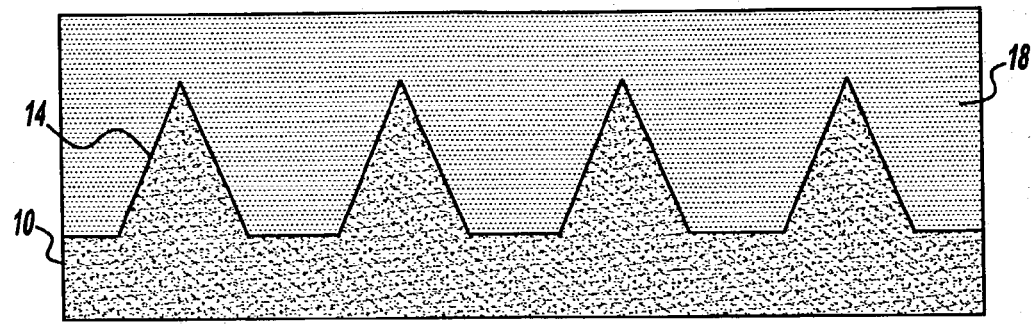
FIG. 4 is a side view of a silicon substrate after a metal electroforming step in accordance with the present invention.
Figure 5:
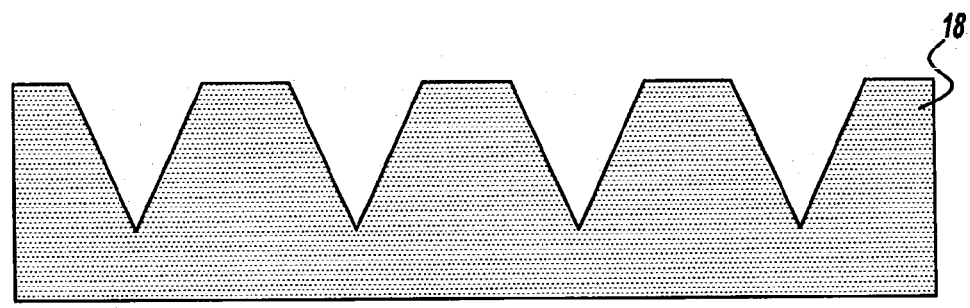
FIG. 5 is a side view of an embossing tool in accordance with the present invention.

Referring now to FIG. 4, in one embodiment a metal is electroformed over the etch features 14 to form an embossing tool 18. As shown, the embossing tool comprises a negative image of the etch features 14 and is freed by dissolving the substrate 10 as shown in FIG. 5 to be further used in generating an optical coating with high aspect ratio microstructures.

The steps illustrated immediately above describe a process wherein a substrate such as silicon is used to produce an embossing tool, followed by destruction of the silicon substrate. It is often desirable to produce more than a single tool from a single silicon substrate. As a general rule, the silicon substrates are relatively expensive to produce and it is preferred to make multiple copies of tools from the same substrate. Instead of electroforming a metal directly over the etch features of a substrate such as silicon, in a preferred embodiment a readily demoldable material may be applied to the etch features. The material may then be removed from the silicon substrate without destroying it, providing a negative of the etch features of the substrate. A preferred material for this replication step is a silicone. Thereafter, in a preferred embodiment a layer of silicone containing a conductive substance such as carbon may be applied to the negative features of the silicone replica, producing a conductive substrate onto which a metal may be electroformed to make an embossing tool according to the invention.

After electroforming, the conductive silicone material may be removed from the metal tool (by dissolution in hot aqueous potassium hydroxide). In this way, embossing tools may be produced without requiring multiple fabrication of an expensive substrate such as those made from silicon with anisotropic and isotropic etching step described above.

Silicone resin, as it cures, will, in general, bond to a previously cured layer of silicone. To avoid this, a coating of release agent may be applied to the first (negative) layer before the second (positive) layer is cured. If there are pinholes in the release layer, the silicone bonded there may tear, potentially ruining both the positive replica as well as the negative master. If the release layer is too thick, the fidelity of the replicated features may be degraded.

In a preferred embodiment, a thin film of noble metal, such as gold, may be evaporatively deposited onto the first (negative) replica. This provides a transferable conductive release layer. A second layer of a curable resin, such as acrylic, epoxy, or polyurethane, can then be cured over the metallic film. After curing, the second (positive) replica is peeled away. The metallic film transfers to the second (positive) replica, providing a platable surface.

Figure 6:
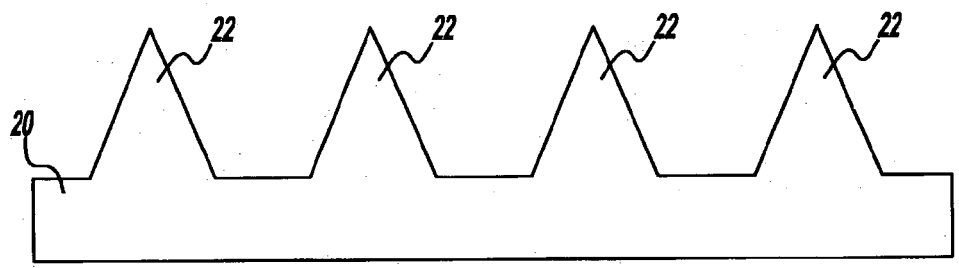
FIG. 6 is a side view of an embossed polymer sheet having a high aspect ratio microstructure in accordance with the present invention.

To generate an optical coating (optically active microtextured surface) with a microstructure as shown in FIG. 6, the embossing tool 18 is generally pressed against optical coating 20 to form a microstructure 22. As illustrated, the microstructure 22 is a negative image of the embossing tool surface, and is thus approximately the same image as the microstructure comprising the tapered etch features 14 on the silicon wafer 10. Accordingly, a relatively low cost embossing tool is provided to create a high aspect ratio microstructure 22 in an optical coating 20 for improved optical performance.

Figure 7A:
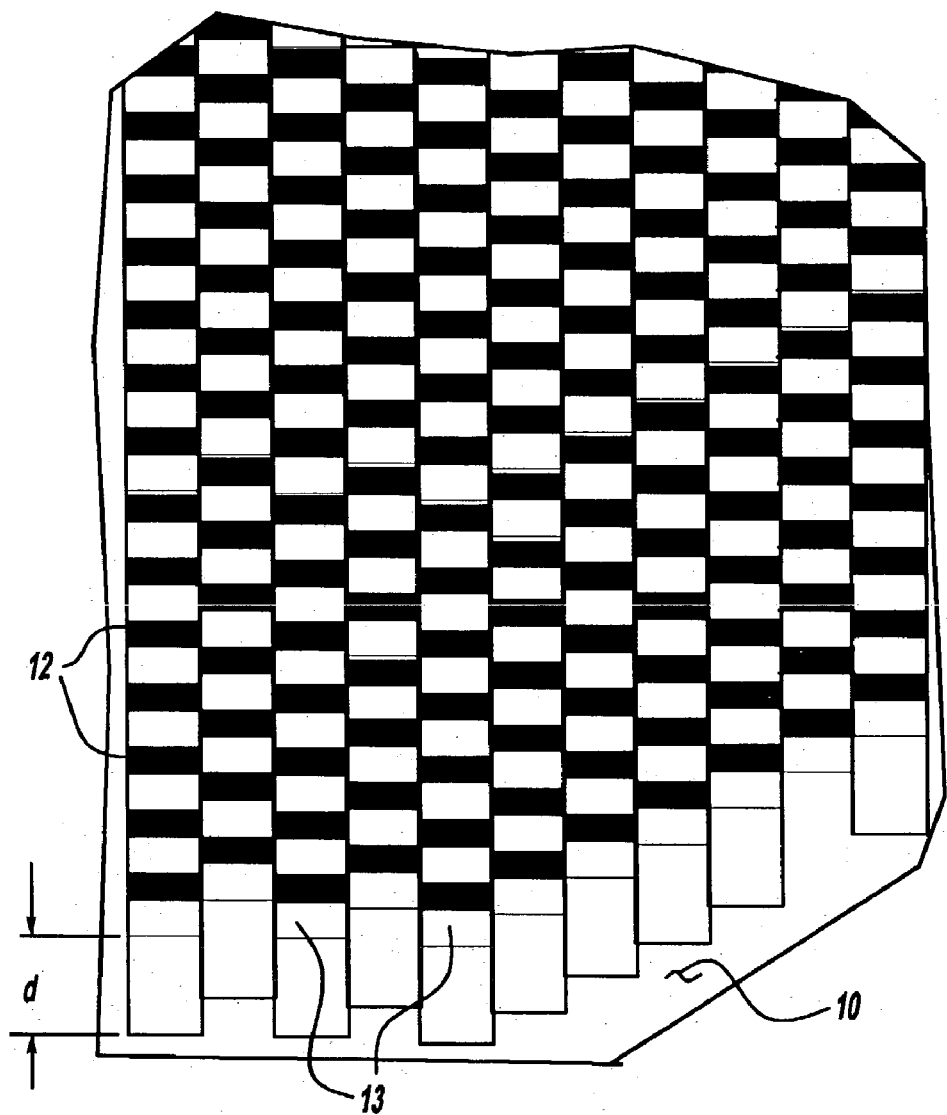
FIG. 7a shows columnar pits separated by columns in a substrate after an anisotropic etching step.
Figure 7B:
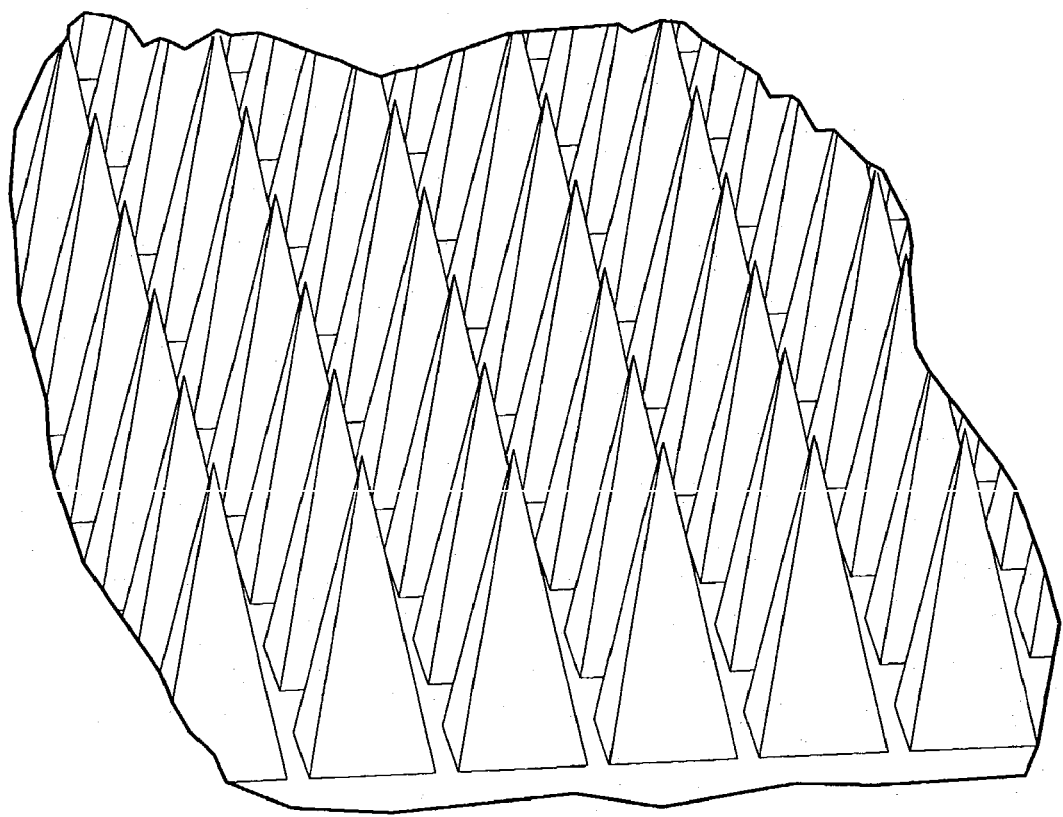
FIG. 7b shows tapered etch features in the same substrate after a subsequent isotropic etching step.

FIGS. 7a and 7b show the condition of the substrate surface after the anisotropic etch (FIG. 7a) and after the subsequent isotropic etch (FIG. 7b). In a preferred embodiment, the anisotropic etch produces rectangular shaped columns 13 between etched columnar pits 12, such as illustrated in FIG. 7. Applying an isotropic etch then preferentially etches the top of the columns and forms tapered pointed microstructures such as shown in FIG. 7b (at higher magnification than in FIG. 7a). The figures illustrate a regularly spaced series of microstructures characterized by a period between columns of about 3 micrometers.

In a preferred embodiment, the etch features produced by the isotropic etching step take the form of pyramids with slightly curved faces. As illustrated schematically in FIG. 7b, the etch features approach the surface-relief pattern for an equivalent quintic on a substrate whose refractive index is 1.45. The shape of the etch features thus approximates the "quintic" shape described as near optimum for producing a graded refractive index profile at a dielectric interface in Southwell, Journal of the Optical Society of America A, vol. 89 (1991), pages 549–553, the disclosure is incorporated by reference in its entirety.

Applying an isotropic etch as the second step to the columnar structural features preferentially etches the tops of the columns and forms tapered and pointed structural features desired for reduction of optical reflection.

As further shown in FIG. 3, the tapered or pointed etch features 14 are also characterized by parameters a and b as illustrated. Parameter a is the distance between the etch features at the bottom of the well at the interface between the bulk portion of the substrate and the etched surface region comprising the etch features. Parameters b are the distances between the etch features at a point above the bottom of the well. As shown in FIG. 3, there are a number of parameters, designated as $b_1$, $b_2$, $b_3$, etc. A key feature of the structure of the substrate produced by the method of the invention is that the etch features are "tapered", meaning that the distances b are greater than the distance a. As shown, the distance a will, in some embodiments, be approximately the same as the distance between columns (shown as X' in FIG. 1). During isotropic etch, the columns formed from the anisotropic etch are etched away faster at the top than at the bottom. In a preferred embodiment, isotropic etch is carried out for a time sufficient to form the tapered etch features without significantly etching away material from the bottom of the well.

FIG. 3 shows the tapering of the etch features in one dimension for clarity. Other cross-sectional views of the etch features may also be chosen to illustrate the tapering.

The etch features are separated by a period illustrated as the variable X in FIG. 3. Furthermore, the etch feature is characterized by an aspect ratio defined as Y over X also illustrated in FIG. 3. That is, the aspect ratio is the ratio of the depth of the pits 12 in relation to the distance between the centers of adjacent columns or pyramids 14. The depth Y of the etch features is generally approximately the same as the depth d of the columnar pits originally etched in the substrate, illustrated in FIGS. 1 and 7A. In a preferred embodiment, Y is the same or slightly smaller than d. As illustrated, the embossing tool contains a surface region comprising microstructures that are the negative of the etch features shown in FIG. 3. Accordingly, the optically active surface texture produced by the embossing tool will be a positive of the features illustrated in FIG. 3. Thus, light will be incident on a surface such as that illustrated in FIG. 3, which surface contains microstructures having a depth equal to Y and a period X separating the microstructures.

Light incident on a surface is either transmitted through the surface, absorbed by the surface, reflected from the surface, or scattered by the surface. To achieve a non-reflective, "moth-eye" surface, it is desired to maximize the amount of light transmitted through the surface and minimize the amounts reflected or scattered. The effectiveness of the textured surface as an anti-reflection layer is a function of the wavelength of the incident light. When the wavelength of the incident light is short enough that the array appears as a diffraction grating, then light is scattered. When scattering is increased, transmission of light through the surface is reduced. In order to avoid diffraction grating scattering from the arrays of microstructure, the period X between the microstructure should be less than the wavelength divided by the refractive index of the substrate. In a preferred embodiment, the period between microstructures of the textured surface is from about one half to one third of the wavelength of the incident light. A range of 2.5 to 3.5 micrometers for the period is practical for operation in the long-wave (8 to 14 micron) infrared wavelength region.

In addition, the aspect ratio Y over X should have a value such that scattering and reflection are minimized while maximizing transmission of the incident light. As a practical matter, an aspect ratio of at least 1 is preferred in order to see a diminution of reflected or scattered light. Preferably the aspect ratio is at least 1.5 and more preferably 2 or greater. As the aspect ratio is increased from about 1.5, one starts to see improved transmission through the surface. As a practical matter, the diminution of scatter and concomitant improvement of transmission increases up until an aspect ratio of about 4.5 where approximately 99.5 percent of the light is transmitted. Above an aspect ratio of about 4.5, little improvement in transmission is seen. Additionally, beginning at an aspect ratio of about 3.5, a damage threshold is reached, wherein the textured surface is more readily damaged by handling because of the relatively high microstructures in relationship to the distance between them. Generally, textured surfaces having an aspect ratio of 4.5 or greater tend to be readily damaged during handling, and are less preferred.

As a general rule, the structure of the embossing made by the process of the invention may be described as comprising a bulk portion and a surface portion comprising microstructures. The microstructures in the surface region of the tool are in a configuration that is essentially the negative of the microstructures described above with respect to the substrate.

Within the constraints of the discussion above, it is generally observed that for materials having a higher index of refraction, a higher aspect ratio of the microstructures in the textured surface is preferred. Thus, the aspect ratio preferably ranges from 1 to 5. Preferably the aspect ratio is 1.5 or greater and preferably 4.5 or less. In a preferred embodiment, the aspect ratio is 2 or greater. In addition, it is preferred that because of the damage threshold the aspect ratio be 4.5 or less, preferably 4 or less and more preferably 3.5 or less.

The invention provides a method for making a high aspect ratio tool with control of the shape of the features at the surface. In a preferred embodiment, the isotropic etch produces tapered or oblique shaped features that approximate quintic shape shown to be ideal for minimizing reflection and scattering at an optical surface.

The description of the invention is merely exemplary in nature and, thus, variations that do not depart from the substance of the invention are intended to be within the scope of the invention. Such variations are not to be regarded as a departure from the spirit and scope of the invention.

What is claimed is:

1. A process for embossing an optically active surface texture in an optical coating comprising:

(a) inductively coupled plasma etching a plurality of high aspect ratio columnar pits, separated by columns in a silicon substrate;
(b) reactive ion etching the columns, thereby forming a microstructure comprising tapered etch features;
(c) transferring the microstructure to a metal embossing tool; and
(d) pressing the embossing tool against a material comprising the optical coating,
wherein the aspect ratio is from 1.0 to 5.0.

2. A process according to claim 1, wherein the aspect ratio is 1.5 or greater.

3. A process according to claim 1, wherein the aspect ratio is 4.5 or less.

4. A process according to claim 1, wherein the aspect ratio is 4.0 or less.

5. A process according to claim 1, wherein the aspect ratio is 2–3.5.

6. A process according to claim 1, wherein the material comprises a thermoplastic.

7. A process according to claim 1, further comprising heating the material while pressing the embossing tool against it.

8. A process for embossing high aspect ratio microstructures comprising the steps of:
(a) inductively coupled plasma etching a plurality of high aspect ratio columnar pits in a silicon substrate;
(b) reactive ion etching the high aspect ratio columnar pits into relatively pointed obelisks, thereby forming etch features;
(c) rinsing the silicon substrate;
(d) vapor depositing a conductive layer on the silicon substrate;
(e) electroforming a metal on the etch features to create an embossing tool; and
(f) pressing the embossing tool against a material.

9. The process of claim 8, wherein the aspect ratio is greater than 5 to 1.

* * * * *